United States Patent [19]
Gerry et al.

[11] Patent Number: 5,488,766
[45] Date of Patent: Feb. 6, 1996

[54] WEATHER-RESISTANT ELECTROMAGNETIC INTERFERENCE SHIELDING FOR ELECTRONIC EQUIPMENT ENCLOSURES

[75] Inventors: Michael Gerry, Mantua, N.J.; David Z. Kelly, Wilmington, Del.; Michael G. Ryan, Newark, Del.; Thomas E. Dykes, Wilmington, Del.; Robert Sassa, Newark, Del.

[73] Assignee: W. L. Gore & Associates, Inc., Newark, Del.

[21] Appl. No.: 319,762

[22] Filed: Oct. 7, 1994

Related U.S. Application Data

[62] Division of Ser. No. 762,718, Sep. 19, 1991, Pat. No. 5,401,901.

[51] Int. Cl.$^6$ .................................................... H01P 11/00
[52] U.S. Cl. ...................... 29/600; 174/35 R; 174/35 MS
[58] Field of Search ................... 29/600, 840; 174/35 R, 174/35 MS

[56] References Cited

U.S. PATENT DOCUMENTS

| | | |
|---|---|---|
| 2,956,281 | 10/1960 | McMillan et al. .......................... 29/600 |
| 4,187,390 | 2/1980 | Gore ..................................... 174/102 R |
| 4,439,768 | 3/1984 | Ebneth et al. . |
| 4,531,957 | 7/1985 | Malik . |
| 4,557,957 | 12/1985 | Manniso . |
| 4,720,400 | 1/1988 | Manniso . |
| 4,749,625 | 6/1988 | Obayashi et al. ........................ 428/624 |
| 4,784,899 | 11/1988 | Ono et al. . |
| 4,833,008 | 5/1989 | Derby . |
| 4,903,169 | 2/1990 | Kitagawa et al. ..................... 29/840 X |
| 4,943,477 | 7/1990 | Kanamura et al. ......... 174/35 RMS X |
| 4,965,408 | 10/1990 | Chapman et al. .................. 174/35 MS |
| 4,980,223 | 12/1990 | Nakano et al. .................... 174/35 R X |

FOREIGN PATENT DOCUMENTS

| | | |
|---|---|---|
| 0160439 | 11/1985 | European Pat. Off. . |
| 2519986 | 11/1975 | Germany . |
| 3710322 | 10/1987 | Germany . |
| 63-288098 | 11/1988 | Japan ................................ 174/35 R |
| 1506713 | 4/1978 | United Kingdom . |
| 93/08674 | 4/1993 | WIPO . |

OTHER PUBLICATIONS

Reseach Disclosure #30027, Apr. 1989.

*Primary Examiner*—Carl J. Arbes
*Attorney, Agent, or Firm*—Gary A. Samuels

[57] ABSTRACT

Weather-resistant electromagnetic radiation shielding materials and structures for electromagnetic interference attenuation for electronic equipment situated in unshielded outdoor housings are described.

11 Claims, 2 Drawing Sheets

5,488,766

WEATHER-RESISTANT ELECTROMAGNETIC INTERFERENCE SHIELDING FOR ELECTRONIC EQUIPMENT ENCLOSURES

This application is a division of application Ser. No. 07/762,718 filed Sep. 19, 1991, now U.S. Pat. No. 5,401,901 filed Mar. 28, 1995.

FIELD OF THE INVENTION

This invention relates to electromagnetic radiation shielding materials and, more particularly, to weather-resistant electromagnetic radiation-shielding constructions for exterior-mounted electronic equipment enclosures.

BACKGROUND OF THE INVENTION

Due to rapid evolution and use of electronic technologies problems associated with incidental electromagnetic radiation have increased significantly. The trend to use of increasingly higher equipment operating frequencies leads to increasingly greater amounts of electromagnetic noise and interference emissions from the equipment. At the same time, the electronic components of the equipment have become smaller and more sensitive, making them more susceptible to adverse influence or damage by electromagnetic radiation to which they are exposed. Consequently, more stringent performance standards and regulations have been implemented that require new equipment to be designed and constructed with higher shielding characteristics that provide for control of emissions and protection against interference from incidental electromagnetic radiation.

Older electronic equipment, on the other hand, while constructed in compliance with standards effective at the time of their manufacture, often lack sufficient shielding to protect them from current levels of electromagnetic interference (EMI) to which they are exposed and, in many cases, are themselves a source of EMI. When located in clusters or confined to small outdoor areas such as building rooftops, equipment compounds, boat or ship superstructures, etc., the problems associated with inadequate EMI shielding become more acute as proximity makes it more likely that each piece of equipment will adversely affect, and be adversely affected by, its neighboring equipment. Such equipment includes exterior-mounted components of instrument systems, radio- and telecommunication systems, marine navigation systems, aircraft detection and control systems, electronic warfare systems, and the like, which, except for the lack of adequate EMI shielding, have nothing wrong with them and are expected to be usable for many years. It has become very desirable to upgrade these systems by providing them with sufficient EMI shielding to ensure their continued operation. It is also very desirable that modifications to equipment for EMI shielding be added quickly, inexpensively, and on-site so that the much larger systems, for example, weather stations, ships, airports, military facilities, etc., of which they are key elements are not rendered ineffective or inoperative for extended periods of time.

Exterior-mounted equipment needing EMI shielding are often mounted and housed in reinforced plastic enclosures in such a way that EMI shielding modifications to the inside surfaces of the enclosure or to the equipment within the enclosure are impractical or ineffective. In these instances, EMI shielding modifications must be made outside the enclosures, thus exposing them to a variety of weather and outdoor environments. Weather resistance and corrosion resistance are particularly important considerations for applications involving marine or coastal environments.

One method for providing EMI shielding to exterior-mounted equipment enclosures is to paint them with an electrically-conductive paint, for example, with paints filled with Nickel or Zinc particles. Such paints are effective in providing EMI shielding when freshly applied, however, their weather resistance and corrosion resistance in marine environments are such that they must be reapplied at frequent intervals, typically 3 to 6 months. Their performance and use lifetime is somewhat better in less severe environments.

SUMMARY OF THE INVENTION

The present invention is a weather-, chemical-, and gas-resistant material formed to cover electronically-unshielded housings for protection of electronic equipment by attenuation of emitted and received incidental electromagnetic radiation.

This invention provides an electromagnetic radiation shielding weather-resistant laminated composite material comprising a layer of electrically-conductive material to each side of which is adhered a layer or a multi-layered assembly of porous polytetrafluoroethylene material. It further provides a process for attenuation of electromagnetic radiation to electronic equipment situated in unshielded outdoor housings comprising the steps of fashioning, erecting, and fixing in place enclosing constructions around the housings consisting substantially of panels of electromagnetic radiation shielding weather-resistant laminated composite material.

The structures formed of the EMI shielding material of the invention may be close-fitting or attached to the housing enclosing the electronic equipment or, may be independently supported and free-standing, for example, as a tent-like structure.

DETAILED DESCRIPTION OF THE PREFERRED EMBODIMENTS

Figure 1:
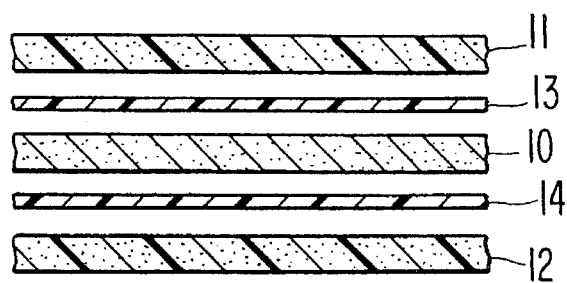
FIG. 1 is an exploded cross section of the material of the invention.

In its broadest embodiment, the invention comprises, referring to FIG. 1, a layer of electrically conductive material 10. This layer may be any material having sufficient electrical conductivity to reflect, intercept or otherwise attenuate the energy of incident electromagnetic radiation presented to it. It is beneficial if this material of the electrically-conductive layer has inherent weather- and chemical-resistant properties. The preferred material for the electrically-conductive layer 10 is porous expanded polytetrafluoroethylene membrane containing electrically conductive filler particles. This inorganic particle Filled membrane can be prepared by coagulation of a mixture of electrically-conductive particles with polytetrafluoroethylene particles suspended in an aqueous dispersion and processing the mixture as described in U.S. Pat. Nos. 3,953,566 and 4,187,390.

Suitable electrically-conductive filler particles include metal particles such as stainless steels, nickel, gold, silver, and the like or, preferably, high conductivity carbon black particles such as a available from Akzo Chemical America, Inc., Cabot Corporation, Degussa Corporation and others. The concentration of particles in the porous expanded polytetrafluoroethylene membrane containing electrically-conductive particles is, for metal particles, preferably in the range 40–90 volume percent and, for carbon black particles, preferably in the 20–70 volume percent. An alternatively preferred material is metallized porous polytetrafluoroethylene membrane as described in U.S. Pat. No. 4,557,957. Other materials which may be used as the electrically-conductive layer include metallized woven and non-woven fabrics, metal wire mesh or cloth, metal foils, and the like.

To protect the surfaces of the electrically-conductive layer 10 from mechanical damage as well as for environmental protection porous polytetrafluoroethylene protective layers 11 and 12 are laminated to each surface of the electrically-conductive layer 10 using thermoplastic polymer adhesives 13 and 14 with application of heat and pressure. The protective layer is preferably a porous expanded polytetrafluoroethylene membrane or, alternatively, a woven fabric of expanded polytetrafluoroethylene fibers.

Layers 13 and 14 are adhesives used to laminate layers 11 and 12 to layer 10. These adhesives may be fluorinated and non-fluorinated thermoplastic polymers where their adhesive properties, physical properties, weather resistance, and electromagnetic radiation transmission properties are suitable for the composite material and its end uses. Suitable thermoplastic materials include perfluoroalkoxytetrafluoroethylene (PFA), ethylenetetrafluoroethylene (ETFE), polychlorotrifluoroethylene (CTFE), polyvinylidenefluoride (PVDF), polyethylene, polypropylene, and the like. For applications where resistance to moisture penetration is especially important, the thermoplastic polymer layer may be a non-porous continuous film. Preferably layer 13 is fluorinated ethylene-propylene copolymer (FEP). Preferably also, layer 14 can be a polyolefin or a polyester, and can be a non-woven web or a continuous film.

Figure 2:
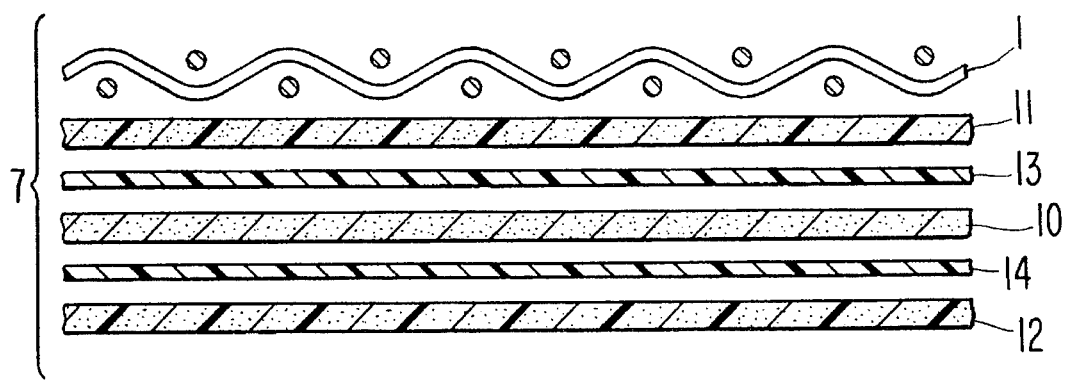
FIG. 2 is an exploded cross-section of a preferred embodiment of the material of the invention.

One preferred embodiment of the invention can best be understood by reference to FIG. 2. Laminated composite material 7 is shown in exploded cross-section in FIG. 1, is constructed by first making a coated fabric 1 by coating a woven fabric of polytetrafluoroethylene fibers with a dispersion of polytetrafluoroethylene particles or a dispersion of thermoplastic fluoropolymer particles, to about three to ten percent by weight particle add-on, and laminating said coated fabric 1 to a porous polytetrafluoroethylene membrane 11 using heat and pressure, for example, by a metal surfaced hot-roll and rubber surfaced pinch or by heated press, to adhere the layers. The woven polytetrafluoroethylene fabric 1 outer layer of composite material 7 is preferably made of porous expanded polytetrafluoroethylene fibers and the porous polytetrafluoroethylene membrane 11 is preferably also porous expanded polytetrafluoroethylene.

By interposing a thermoplastic polymer layer 13 between the porous polytetrafluoroethylene membrane 11 and an electrically-conductive material layer 10 and applying heat and pressure as described above, the exterior layers 11 and 13 are laminated to the electrically-conductive material layer 10.

For continuous lamination using hot-rolls lamination temperatures will vary depending on materials to be laminated, thermoplastic polymer adhesive to be used, roll surface speed and residence time of the materials on the hot roll. Hot-roll surface lo temperature will be adjusted to soften or melt the thermoplastic polymer adhesive and will often be more than 100° C. above the melting range of the polymer adhesive.

For stationary or batch lamination by heated presses, platen surface temperatures are also adjusted to soften or melt the thermoplastic adhesive but are usually lower than required for the continuous lamination process.

Layer 1 provides protection to the other layer. Composite material 7 is a strong, flexible, and durable material which is not harmed by exposure to weather elements, including sunlight, ultraviolet radiation, ozone, temperature extremes, rain, snow, wind, salt water sray or chemicals in the environment. It has excellent electromagnetic radiation attenuation characteristics which reduce or eliminate passage of EMI through the composite material. The composite material is light in weight, requires virtually no maintenance, and can be fashioned into useful constructions by conventional means, for example, by sewing, adhesive bonding, or the like.

If desired, increased oleophobicity to reduce staining by materials borne by oils, greases, solvents and the like, can be imparted by coating any layer of the laminated composite material 7 with a solution of an oleophobic material, such as an amorphous copolymer of perfluoro-2,2-dimethyl-1,3-dioxole and tetrafluoroethylene. The copolymer is available from the DuPont Company as Teflon® AF 1600 or Teflon AF 2400.

The structures formed of the EMI shielding material may also include sections of electromagnetic radiation transparent materials so as to provide openings or windows in the structure through which electromagnetic signals may be transmitted and received, for example, in structures enclosing unshielded radar antenna housings which, although requiring EMI shielding generally, must have unimpeded capability to transmit and receive desirable signals through certain locations in the housing. Such a weather-resistant electromagnetic radiation transparent material is described in U.S. Pat. No. 4,946,736.

Figure 3:
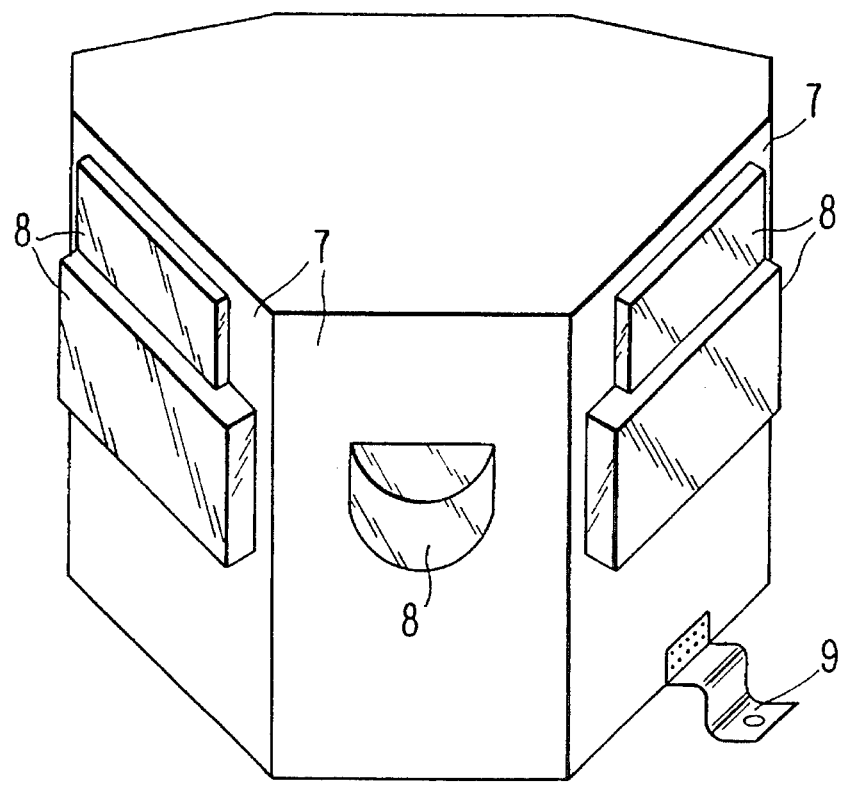
FIG. 3 depicts an electronic equipment housing closely enclosed with the material of the invention.

FIG. 3 shows a construction in which composite material 7 of the invention is combined with sections of a weather-resistant electromagnetic radiation transparent material 8 to form a close-fitting enclosure around a radar antenna housing thus providing EMI shielding around most of the housing and electromagnetic radiation transparency in selected areas for transmission and reception of electromagnetic radiation signals. The weather-resistant electromagnetic transparent material 8 is preferably the laminate for radomes comprising layers of porous expanded polytetrafluoroethylene membrane, fluorinated thermoplastic membrane, and woven fabric of expanded polytetrafluoroethylene described in U.S. Pat. No. 4,946,736.

The sections denoted by 7 and 8 are patterned and cut in panels to conform to the contours of the housing and are joined by conventional means such as sewing, stapling, adhesive bonding, etc. Where electrical continuity between panels is required sections of the non-conductive layers of the composite material 7 are cut or peeled back so that the electrically-conductive layers may be overlapped and joined in contact with each other. To facilitate installation and removal of the enclosure and to permit access into the radar housing for maintenance and repairs certain panels are joined with zippers or Velcro(™) strips. Straps 9 of the composite material may be attached to panels of the enclosure for the purpose of electrical grounding and to hold the enclosure in place on the housing. Many other fastening and grounding means, for example, grommets, screws, rivets, snaps, Velcro(™) strips, adhesives, and the like, may also be used for these purposes.

The enclosure depicted in FIG. 3 and described above is supported by the housing which it encloses. It is readily apparent that by substitution of independent frames or supports for the housing, free-standing tent-like structures of almost any size or shape can be fashioned by the methods described above. As with tents, the frames, supports and covering of the composite material of the invention can be designed to provide portable, easily erected structures having excellent EMI shielding characteristics and excellent weather resistance. These structures, which can be inflatable, are very useful for enclosing EMI-emitting or EMI-sensitive equipment such as generators, transformers, electronic instruments and equipment which are located in outdoor environments and which may require frequent relocation.

Figure 4:
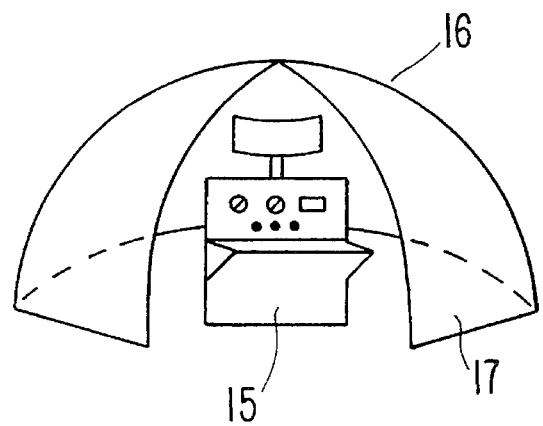
FIG. 4 depicts a tenting cover made of the material of the invention.

In FIG. 4, a tent-like structure 16 having panels 17 of the laminated composite material is shown (with front panels removed) enclosing electronic equipment 15.

EXAMPLES

Example 1

A laminated composite material of the invention was prepared as follows:

1. Woven fabric of expanded polytetrafluoroethylene fibers was coated on one surface with a dispersion of thermoplastic fluoropolymer particles.

The fabric used was 8½ oz/square yard in a 4×1 satin harness weave having 80×72 picks/inch of 400 denier GORE-TEX® expanded polytetrafluoroethylene fibers (supplied by W. L. Gore and Associates, Inc.).

The dispersion, Teflon® FEP 120, is an aqueous dispersion of Teflon FEP particles manufactured by E. I. DuPont de Nemours Co., Inc. The Teflon 120 dispersion was applied by roll-coating, followed by oven-drying to remove the water, providing a 4% (dry-weight) add-on.

2. The coated fabric of (1) was laminated to a porous expanded polytetrafluoroethylene membrane by heating the porous expanded polytetrafluoroethylene membrane on the surface of a metallic hot-roll to a temperature sufficient to melt the Teflon® FEP 120 dispersion particles coated on the above described fabric, and forcing the FEP-coated side of said fabric against the heated surface of the porous polytetrafluoroethylene membrane with a silicone rubber-surfaced pinch-roll.

The porous expanded polytetrafluoroethylene membrane had a thickness of approximately 0.001 inches, a pore volume of approximately 95%, and a structure of interconnected nodes and fibrils as described in U.S. Pat. Nos. 3,953,566 and 4,187,390.

3. The assembly of (2) was laminated to an electrically-conductive material of porous expanded polytetrafluoroethylene containing electrically-conductive carbon black particles using a thermoplastic polymer as adhesive and application of heat and pressure by the hot-roll and pinch-roll as follows:

The assembly of (2), with the fabric side contacting the hot-roll surface, was heated to a temperature sufficient to melt a 0.002 inches thick FEP film interposed between the porous expanded polytetrafluoroethylene membrane side of the assembly and the layer of porous expanded polytetrafluoroethylene containing electrically conductive carbon black particles. Lamination was effected by forcing the layers together with the pinch-roll pressing on the electrically-conductive layer.

The porous expanded polytetrafluoroethylene sheet contained 50% (by weight) Ketjenblack EC-300 electrically-conductive carbon black particles (from Akzo Chemie America) was approximately 0.020 inches thick, has a density of approximately 0.51 grams/cubic centimeter, and electrical volume resistivity of 1.1 ohm-cms.

The thermoplastic polymer used as adhesive was a 0.002 inches thick non-porous film of fluorinated ethylenepropylene (FEP) copolymer (available from many commercial sources).

4. The assembly of (3) was laminated to a porous expanded polytetrafluoroethylene membrane using a lower melting thermoplastic polymer as adhesive and application of heat and pressure by the hot-roll and the pinch-roll as follows:

The porous expanded polytetrafluoroethylene membrane was heated on the hot-roll to a temperature sufficient to melt the 10 non-woven polyolefin web interposed between the membrane and the second side of the electrically-conductive layer of the assembly of (3). Lamination was effected by forcing the layers together with the pinch-roll pressing against the fabric surface of the assembly of (3).

The porous expanded polytetrafluoroethylene membrane had a thickness of approximately 0.003 inches, a pore volume of approximately 90%, and was manufactured as described in the patents listed earlier.

The thermoplastic polymer used as adhesive was a non-woven polyolefin web (Webril M, manufactured by Veratec Co.).

The laminated composite EMI shielding material described above was tested as follows:

LABORATORY TEST

A sample of the composite EMI shielding material was prepared and tested according to ASTM Standard Test Method D4935-89 for Measuring the Electromagnetic Shielding Effectiveness of Planar Materials.

Shielding Effectiveness (SE) was measured to be −26 to −30 decibels (db).

FIELD TESTS

The composite EMI shielding material was patterned, cut and fashioned into a close-fitting cover for a shipboard radar housing. The cover additionally included weather-resistant sections of electromagnetic radiation transparent materials and open (uncovered) sections for reception and transmission of desired signals. Panel sections were joined by sewing and electrically-conductive Velcro(™) strips or zippers for joining the panels were sewn in place. Porous polytetrafluoroethylene membrane was adhesively applied over the sewn seams to restore weather-resistance integrity.

The cover was installed on the radar housing and field tested at sea over a period of about one week. Extreme weather conditions were not encountered during the test period.

The cover was repeatedly removed and reinstalled during the test period and electromagnetic radiation measurements were made inside the housing with and without the cover in place.

Durability and EMI shielding performance of the structure during the test period were excellent and appeared to be unaffected by handling or weather conditions of the test. No damage or deterioration of the composite material was observed. Average Shielding Effectiveness was determined to be −30 decibels.

We claim:

1. A process for attenuation of electromagnetic radiation for electronic equipment situated in unshielded outdoor housings comprising the steps of fashioning, erecting, and fixing in place a construction of panels of electromagnetic radiation shielding weather-resistant laminated composite material comprising a flexible layer of electrically-conductive material having at least one layer of porous polytetrafluoroethylene material adhered to each side.

2. The process as recited in claim 1, wherein the enclosing construction is free-standing, supported by framework independent of the electronic equipment housing which it encloses.

3. The process as recited in claim 1, wherein the layered porous polytetrafluoroethylene material is selected from (a) woven fabric of polytetrafluoroethylene fibers or (b) porous expanded polytetrafluoroethylene.

4. The process as recited in claim 1, wherein the layer of electrically-conductive material is metallized porous polytetrafluoroethylene.

5. The process as recited in claim 1, wherein the layer of electrically-conductive material is a fabric having a surface coated with metal.

6. The process as recited in claim 1, wherein the layer of electrically-conductive material is metal wire mesh.

7. The process as recited in claim 1, wherein the layer of electrically-conductive material is porous polytetrafluoroethylene containing electrically-conductive filler particles.

8. The process as recited in claim 7, wherein the electrically-conductive filler particles are carbon black.

9. A process for attenuation of electromagnetic radiation for electronic equipment situated in unshielded outdoor housings comprising the steps of fashioning, erecting, and fixing in place a construction of panels of electromagnetic radiation shielding weather-resistant laminated composite material comprising (a) at least one layer comprising polytetrafluoroethylene fibers;

(b) at least one layer of porous membrane;

(c) at least one layer of thermoplastic polymer; and (d) at least one layer of electrically-conductive material;

said composite material panels including means to electrically ground them so as to provide electromagnetic radiation shielding.

10. The process as recited in claims 9, wherein said at least one layer of thermoplastic polymer is a non-porous continuous film.

11. The process as recited in claim 10, wherein said at least one layer of thermoplastic polymer is fluorinated ethylene propylene (FEP) copolymer.

* * * * *